(12) United States Patent
Kronholz et al.

(10) Patent No.: US 8,247,282 B2
(45) Date of Patent: Aug. 21, 2012

(54) ENHANCING INTERFACE CHARACTERISTICS BETWEEN A CHANNEL SEMICONDUCTOR ALLOY AND A GATE DIELECTRIC BY AN OXIDATION PROCESS

(75) Inventors: Stephan Kronholz, Dresden (DE); Carsten Reichel, Dresden (DE); Annekathrin Zeun, Dresden (DE); Martin Trentzsch, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 12/905,619

(22) Filed: Oct. 15, 2010

(65) Prior Publication Data

US 2011/0129970 A1     Jun. 2, 2011

(30) Foreign Application Priority Data

Nov. 30, 2009 (DE) .................. 10 2009 047 311

(51) Int. Cl.
| | |
|---|---|
| *H01L 21/8238* | (2006.01) |
| *H01L 21/8234* | (2006.01) |
| *H01L 21/331* | (2006.01) |
| *H01L 21/4763* | (2006.01) |
| *H01L 21/3205* | (2006.01) |

(52) U.S. Cl. ........ 438/199; 438/216; 438/222; 438/275; 438/357; 438/360; 438/585; 438/689; 257/E21.19; 257/E21.625; 257/E21.632; 257/E21.639

(58) Field of Classification Search ............. 257/E21.19, 257/E21.625, E21.632, E21.639
See application file for complete search history.

(56) References Cited

U.S. PATENT DOCUMENTS

| | | | | |
|---|---|---|---|---|
| 5,397,909 | A * | 3/1995 | Moslehi ..................... | 257/383 |
| 6,872,610 | B1 * | 3/2005 | Mansoori et al. ............. | 438/197 |
| 2008/0185649 | A1 * | 8/2008 | Anderson et al. ............. | 257/347 |
| 2009/0236650 | A1 * | 9/2009 | Forbes et al. ................. | 257/314 |
| 2010/0221883 | A1 * | 9/2010 | Kronholz et al. ............. | 438/285 |
| 2010/0289090 | A1 * | 11/2010 | Kronholz et al. ............. | 257/392 |
| 2011/0027952 | A1 * | 2/2011 | Kronholz et al. ............. | 438/231 |

* cited by examiner

*Primary Examiner* — Mohsen Ahmadi

(74) *Attorney, Agent, or Firm* — Williams, Morgan & Amerson, P.C.

(57) ABSTRACT

In sophisticated transistor elements, long-term threshold voltage shifts in transistors comprising a threshold adjusting semiconductor alloy may be reduced by reducing the roughness of an interface formed between the threshold adjusting semiconductor material and the gate dielectric material. To this end, a portion of the threshold adjusting semiconductor material may be oxidized and may be removed prior to forming the high-k dielectric material.

17 Claims, 9 Drawing Sheets

ENHANCING INTERFACE CHARACTERISTICS BETWEEN A CHANNEL SEMICONDUCTOR ALLOY AND A GATE DIELECTRIC BY AN OXIDATION PROCESS

BACKGROUND OF THE INVENTION

1. Field of the Invention

Generally, the present disclosure relates to sophisticated integrated circuits including advanced transistor elements that comprise highly capacitive gate structures including a high-k gate dielectric.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 µm may require a gate dielectric made of silicon dioxide as thin as approximately 1.2 nm.

In such advanced transistor elements, reliability and lifetime thus significantly depends on short channel effects, i.e., impact ionization and hot carrier injection into the gate dielectric material, while gate leakage currents may also significantly increase when using silicon-based gate dielectrics of a reduced thickness. For example, since device dimensions have been scaled down more rapidly compared to the supply voltages, the resulting electrical field strengths in the gate dielectric material have significantly increased, while at the same time the threshold voltage of the transistors, i.e., the voltage at which a conductive channel forms in the channel region, has been reduced in order to improve drive current and switching speed of sophisticated transistors. Consequently, the quality of the gate dielectric material may strongly influence the transistor behavior, while at the same time a high stability of the threshold voltage of the transistor may be required over the rated lifetime in order to fulfill the required device qualifications. Upon further scaling the critical dimensions of transistor elements, a further long known effect may increasingly play an important role for CMOS devices when threshold voltages and, to a less pronounced degree, also the supply voltages are steadily reduced. It has been observed in the late '60s that the application of voltage, such as a negative voltage, in combination with thermal stress to the gate electrode of MOS transistor may result in a shift of the threshold voltage. This effect, also referred to as "bias temperature instability or injection" is mainly present in PMOS transistors and was not considered particularly relevant for semiconductor devices in the following years due to the low influence on the overall device performance of devices, in particular as NMOS devices have increasingly been developed. This situation changed with the introduction of complex CMOS devices including high performance logic circuits in which millions of signal nodes with PMOS and NMOS transistors are typically provided. In these devices, the threshold voltage and the supply voltage have constantly been reduced, while, on the other hand, the electric field strengths across the gate dielectrics have increased. Under such conditions, a change of the threshold voltage may have an even higher impact since transistor operation variability may increase due to the relatively higher influence of a shift of the threshold voltage. Furthermore, the operating states of the transistors resulting in the application of voltage pulses, such as negative and positive voltages, to the gate electrode of PMOS transistors may depend on the signal path considered and the overall operational conditions, thereby resulting in substantially non-predictable threshold shifts within the lifetime of the device. For example, a shift of the threshold voltage over the accumulated operating time may finally lead to a violation of time specifications of the device, which may not allow a further use of the device despite the fact that no other major failure has occurred.

Generally, this effect is also associated with the quality of the gate dielectric material and in particular with the quality of the interface between the semiconductor material in the channel region and the gate dielectric material. In this case, upon certain operational conditions, such as elevated temperatures and other stress conditions, a charge trap is created in the vicinity of the interface, wherein, in particular, holes may be trapped, thereby resulting in a significant shift of threshold voltage by localized positive interface states and the additionally trapped charges. In NMOS transistors, this effect may be significantly less pronounced since the interface states and the fixed charges are of opposite polarity, thereby resulting in lower performance degradation.

In view of reducing short channel effects and undesired gate leakage currents, the replacing of silicon dioxide or at least a portion thereof as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide-based material. It has, thus, been suggested to replace silicon dioxide-based materials, at least partially, with materials of an increased dielectric constant, such as hafnium-based dielectric materials, zirconium oxide and the like. In some conventional approaches a "conventional" gate dielectric material, such as silicon dioxide, silicon oxynitride and the like, may be formed on the semiconductor material of the channel region, followed by the high-k dielectric material, which may then be capped by an appropriate conductive material, such as titanium nitride and the like, in combination with an appropriate metal species, such as lanthanum, aluminum and the like, in order to adjust the work function as may be required for N-channel transistors and P-channel transistors, respectively. To this end, in some conventional approaches, an additional adaptation of the electronic configuration of the semiconductor material in the channel region with respect to the work function may be required, which may be accomplished by providing an appropriate semiconductor material in order to obtain the required band gap offset. For this purpose, in the P-channel transistor, a silicon/germanium semiconductor mixture or alloy may be provided with a specific thickness and germanium concentration in order to obtain the required band gap offset and thus a desired threshold voltage of the P-channel transistor. Typically, a corresponding specifically designed semiconductor material, such as the silicon/germanium alloy and the like, is provided by an epitaxial growth technique at an early manufacturing stage prior to forming the gate dielectric material. Although the usage of high-k gate dielectric materials may enable a further scaling of the channel length of critical transistor elements, it turns out, however, that, in particular, significant threshold voltage instabilities in P-channel transistors may cause significant yield losses, which is believed to be caused by the complex material system of the threshold adjusting semiconductor alloy in combination with the high-k gate dielectric material, as will be explained with reference to FIGS. 1a-1g.

FIG. 1a schematically illustrates a cross-sectional view of a semiconductor device 100 comprising a substrate 101, above which is formed a silicon-based semiconductor material 102 having an appropriate thickness for forming therein and thereabove transistor elements. An isolation structure 102C is formed in the semiconductor layer 102, thereby laterally delineating active regions 102A, 102B. In this context, an active region is to be understood as a semiconductor material in which an appropriate dopant profile is to be created in order to form PN junctions for one or more transistor elements. In the example shown, the active region 102A corresponds to a P-channel transistor while the active region 102B represents an N-channel transistor. That is, the active regions 102A, 102B may comprise, in the manufacturing stage shown, an appropriate basic dopant concentration in order to determine the conductivity of a P-channel transistor and an N-channel transistor, respectively. Moreover, a mask layer 103 is formed on the active regions 102A, 102B, for instance in the form of a silicon dioxide material and the like. Furthermore, an etch mask 104 is provided such that the active region 102B is covered, while the active region 102A, i.e., the mask layer 103 formed thereon, is exposed to an etch ambient 105.

The semiconductor device 100 as illustrated in FIG. 1a may be formed on the basis of the following conventional process strategies. First, the isolation structure 102C is formed on the basis of well-established lithography, etch, deposition, planarization and anneal techniques, in which, for instance, a trench is formed in the semiconductor layer 102, which is subsequently filled with an appropriate insulating material, such as silicon dioxide, silicon nitride and the like. After removing any excess material and planarizing the surface topography, the process is typically continued by performing a plurality of implantation sequences using an appropriate masking regime in order to introduce the required dopant species for generating the basic dopant concentration in the active regions 102A, 102B. After activating the dopant species and re-crystallizing implantation-induced damage, the further processing is continued by forming the mask layer 103 on the basis of an oxidation process and the like, followed by the deposition of a mask material, such as a resist material, that is subsequently patterned into the mask 104 by well-established lithography techniques. Next, the etch process 105 is performed, for instance using a wet chemical etch recipe based on, for instance, hydrofluoric acid (HF), which may remove silicon dioxide material selectively with respect to silicon material.

FIG. 1b schematically illustrates the semiconductor device 100 after the above-described process sequence and after the removal of the etch mask 104 (FIG. 1a). Furthermore, in this manufacturing stage, additional cleaning processes may be performed in order to prepare the surface of the active region 102A for the deposition of a silicon/germanium alloy as required for adapting the threshold voltage in combination with a high-k dielectric material and a gate electrode material still to be formed.

FIG. 1c schematically illustrates the semiconductor device 100 during a selective epitaxial growth process 108 in which process parameters are selected in accordance with well-established recipes such that material deposition is substantially restricted to the exposed active region 102A, while a material deposition on dielectric surface areas, such as the isolation structure 102C and the mask layer 103, is strongly suppressed. Thus, during the selective epitaxial growth process 108 a silicon/germanium alloy 109 may, therefore, be selectively formed on the active region 102A, wherein the material composition as well as the layer thickness have a strong influence on the finally obtained threshold voltage of a P-channel transistor still to be formed in and above the active region 102A. For example, a target thickness of the material 109 may be approximately 10-50 nm with a germanium concentration of approximately 20-30 atomic percent.

FIG. 1d schematically illustrates the semiconductor device 100 when exposed to an etch ambient 110, in which the mask 103 (FIG. 1c) is removed selectively to the semiconductor materials of the active regions 102A, 102B, wherein it should be understood that the active region 102A may now comprise the silicon/germanium alloy 109. Moreover, during the etch process 110, which may be performed on the basis of hydrofluoric acid, the exposed semiconductor surface areas may also be prepared for forming a sophisticated gate dielectric material having an increased dielectric constant, as explained above.

FIG. 1e schematically illustrates the semiconductor device 100 in a further advanced manufacturing stage in which a gate dielectric material 161 is formed on the active regions 102A, 102B. For example, the gate dielectric material 161 comprises a first layer 161A, such as a silicon dioxide material, a silicon oxynitride material and the like, above which a further dielectric material 161B is formed, which may include any appropriate material species for increasing the dielectric constant. For this purpose, the layer 161A is typically provided with a reduced thickness of less than one nanometer, and the layer 161B may have a sufficiently high dielectric constant in order to provide the required capacitive coupling, while a total thickness of the dielectric material 161 may reduce the overall gate leakage currents, as is also previously discussed. The gate dielectric material 161 may be formed on the basis of any appropriate process technique, such as deposition techniques in the form of chemical vapor deposition (CVD) and the like. During the deposition of the materials 161A, 161B, it is believed that, in particular, the interface 109S between the dielectric material 161 and the silicon/germanium alloy 109 may have an increased roughness, which is assumed to cause significant threshold voltage variations.

FIG. 1f schematically illustrates the semiconductor device 100 in a further advanced manufacturing stage. As illustrated, a gate layer stack 160S is formed above the active regions 102A, 102B and comprises the gate dielectric material 161. Furthermore, a first material system 162 is formed above the active region 102A and may comprise any appropriate conductive materials in order to connect to the gate dielectric material 161 so as to obtain a desired work function. For example, the material system 162 may comprise a titanium nitride material formed on the gate dielectric material 161, followed by a work function adjusting species, such as aluminum, followed by a further titanium nitride material. On the other hand, the material system 163 is formed above the active region 102B so as to connect to the gate dielectric material 161 in order to obtain the desired work function. For example, the material system 163 may comprise a layer of lanthanum material followed by a titanium nitride material. Moreover, an electrode material 164, such as amorphous silicon, polysilicon and the like, in combination with a dielectric cap material 165, such as silicon dioxide, silicon nitride and the like, are provided in the gate layer stack 160S.

The material system 162 may be provided on the basis of any appropriate deposition technique, such as CVD, physical vapor deposition (PVD) and the like. For example, titanium nitride may be sputter deposited in a nitrogen-containing ambient, followed by the sputter deposition of aluminum and the deposition of a titanium nitride material. Thereafter, this layer system may be patterned so as to remove at least the aluminum material from above the active region 102B. Next, the material system 163 may be deposited, followed by the deposition of the material 164 and the cap layer 165. It should be appreciated that further materials may be deposited, such as hard mask materials and the like, as required for the further processing of the device 100.

FIG. 1g schematically illustrates the semiconductor device 100 in a further advanced manufacturing stage. As shown, a first gate electrode structure 160A is formed on the active region 102A, which includes the threshold adjusting semiconductor alloy 109, while a second gate electrode structure 160B is formed on the active region 102B. The gate electrode structures 160A, 160B may be formed on the basis of any appropriate complex lithography and etch techniques in order to obtain the desired gate length of, for instance, 40 nm and less in sophisticated semiconductor devices. It should be appreciated that the gate length is to be understood as the horizontal extension of the gate electrode structures 160A, 160B, for instance by using the lateral extension of the material systems 162 and 163, respectively.

Thereafter, the further processing may be continued by forming drain and source regions in the active regions 102A, 102B in accordance with any appropriate process strategy.

As previously indicated, in particular, a corresponding transistor including the gate electrode structure 160A may exhibit significant threshold voltage variations over the operational lifetime, which is believed to be caused by the increasing number of trapped interface charges, as explained above. Consequently, reliability of the device 100 over lifetime may not be guaranteed, thereby contributing to a significant yield loss.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques for forming transistor elements, such as P-channel transistors, in which a threshold adjusting semiconductor alloy, such as a silicon/germanium alloy, may be provided to adapt a band gap offset with respect to an electrode metal in combination with a high-k gate dielectric material, wherein a superior long term stability of the threshold voltage may be achieved. Without intending to restrict the present disclosure to the following explanation, it is assumed, and corresponding measurements seem to corroborate this assumption, a pronounced surface roughness at an interface between the dielectric material and the threshold adjusting semiconductor alloy may have a strong influence on the long-term stability of the threshold voltage and also generally on any threshold voltage variability of the P-channel transistors. Thus, the present disclosure contemplates a process technique in which the interface characteristics may be improved, which may be accomplished by treating an exposed surface area of the threshold adjusting semiconductor alloy prior to forming the high-k gate dielectric material thereon. In some illustrative embodiments disclosed herein, the surface treatment may be performed as an oxidation process in combination with an appropriate removal process, thereby providing a surface of superior quality. Consequently, the subsequent dielectric material may be formed with a lesser degree of irregularities, thereby contributing to superior interface characteristics, which in turn may provide superior behavior with respect to negative bias temperature injection or instability or generally pulse bias temperature injection.

One illustrative method disclosed herein relates to forming a gate electrode structure. The method comprises forming a layer of a semiconductor alloy on a semiconductor region of a semiconductor device. The method further comprises oxidizing the layer of semiconductor alloy so as to form a first sub-layer comprised of the semiconductor alloy and to form a second sub-layer comprised of an oxide of the semiconductor alloy. Moreover, the method comprises removing the second sub-layer and forming a gate layer stack on the first sublayer, wherein the gate layer stack comprises a gate dielectric material, a work function adjusting species and an electrode material. Finally, the method comprises forming the gate electrode structure of a transistor from the gate layer stack.

A further illustrative method disclosed herein comprises forming a threshold adjusting semiconductor material on a first semiconductor region, while masking a second semiconductor region. The first and second semiconductor regions are formed in a semiconductor layer of a semiconductor device. The method further comprises performing a surface treatment to modify a portion of the threshold adjusting semiconductor material. Furthermore, the modified portion is removed such that a layer of the threshold adjusting semiconductor material is preserved. Additionally, the method comprises exposing the second semiconductor region and forming a gate dielectric material on the layer of threshold adjusting semiconductor material and on the second semiconductor region.

A still further illustrative method disclosed herein relates to forming a gate dielectric material of a P-channel transistor. The method comprises forming a silicon/germanium alloy on a semiconductor region and oxidizing a portion of the silicon/germanium alloy so as to preserve a layer of the silicon/germanium alloy. The method further comprises removing the oxidized portion so as to expose the layer of the silicon/germanium alloy. Additionally, the method comprises forming a dielectric material on the layer of the silicon/germanium alloy.

BRIEF DESCRIPTION OF THE DRAWINGS

The disclosure may be understood by reference to the following description taken in conjunction with the accompanying drawings, in which like reference numerals identify like elements, and in which.

Figure 1A:
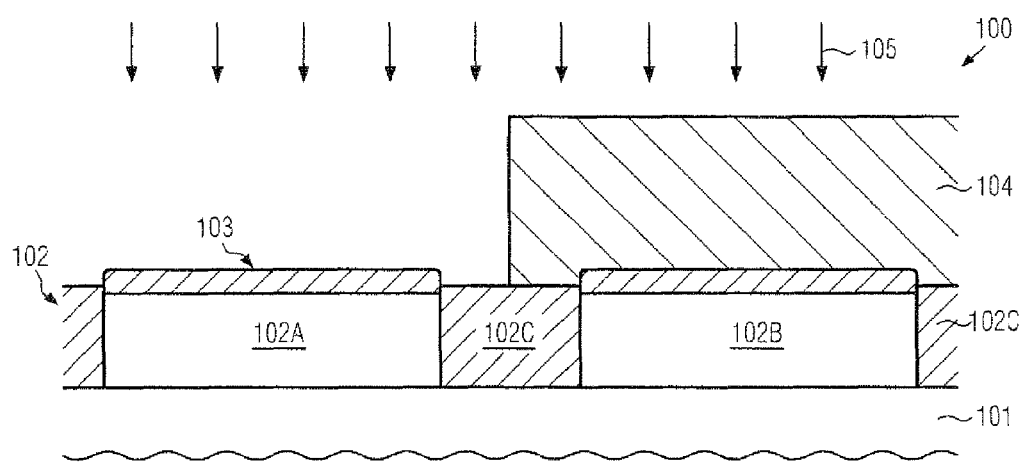
FIGS. 1a-1g schematically illustrate cross-sectional views of a semiconductor device during various manufacturing stages in forming gate electrode structures of a P-channel transistor and an N-channel transistor, respectively, on the basis of a silicon/germanium alloy, according to conventional strategies.
Figure 1B:
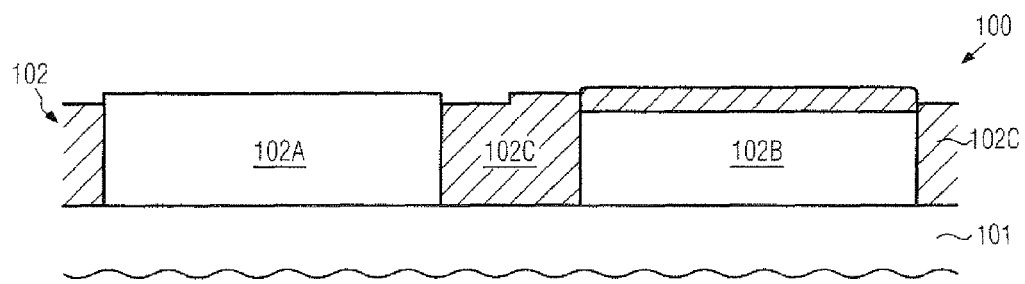
Figure 1C:
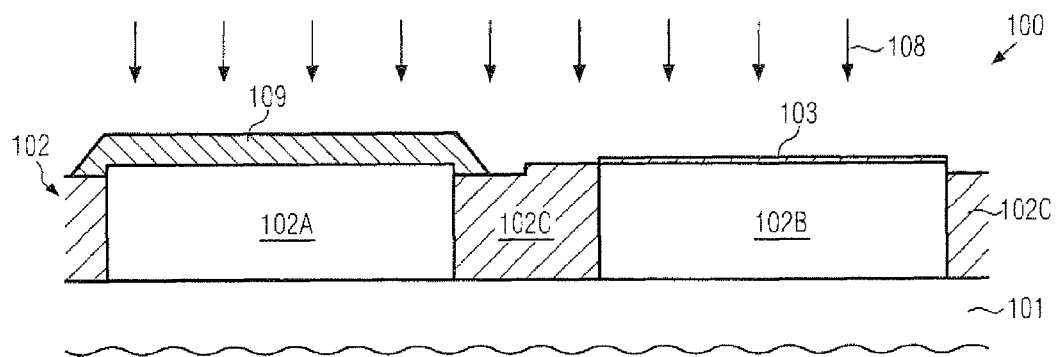
Figure 1D:
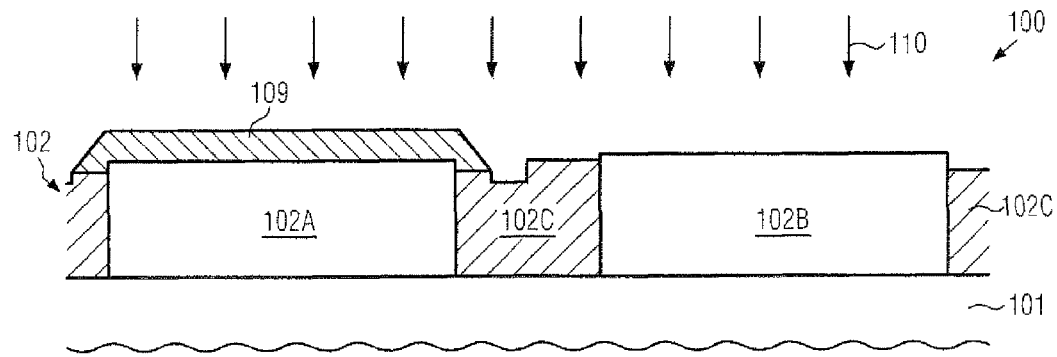
Figure 1E:
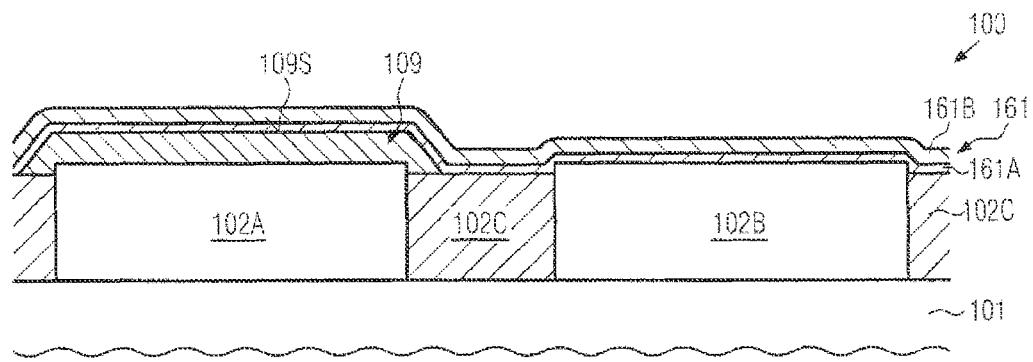
Figure 1F:
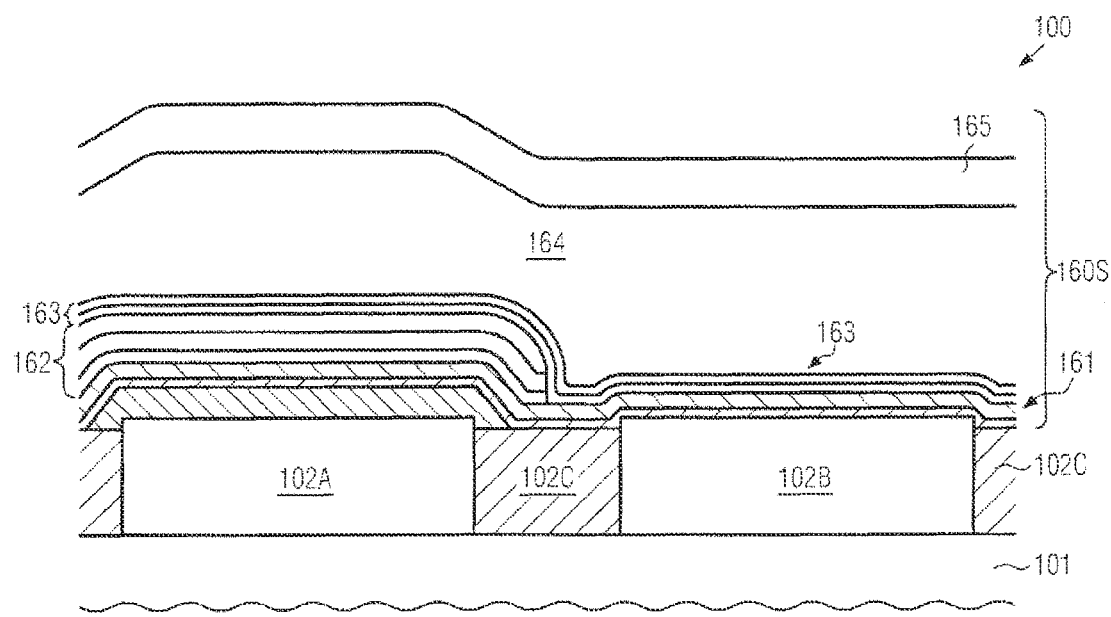
Figure 1G:
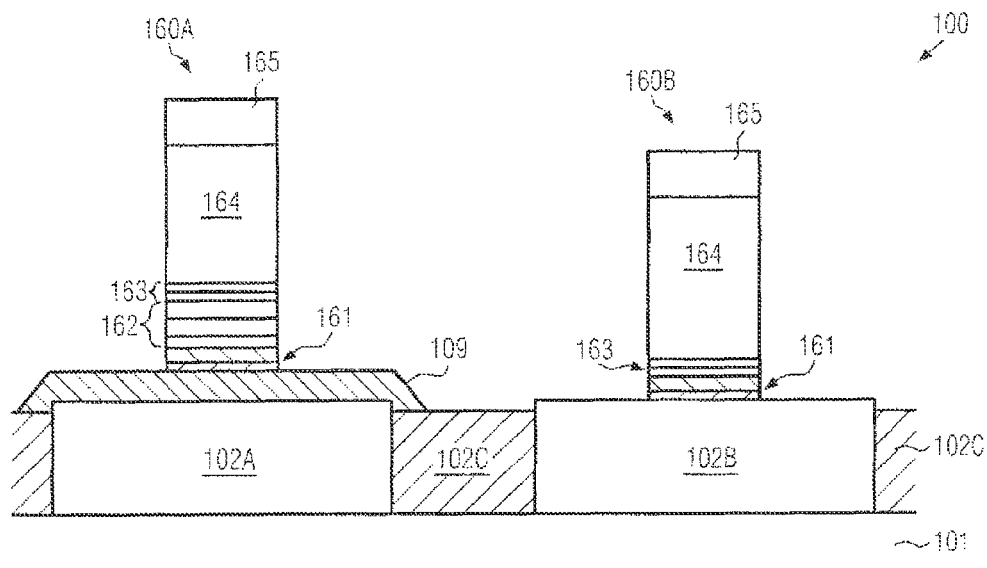

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques in which sophisticated gate electrode structures and transistors may be formed on the basis of a high-k dielectric material and a metal-containing electrode material, wherein the threshold voltage may be adjusted in an early manufacturing stage on the basis of a threshold adjusting semiconductor alloy for one type of transistor. The threshold adjusting semiconductor alloy, such as a silicon/germanium alloy, may be formed so as to have a superior surface condition prior to forming the high-k gate dielectric material, thereby achieving enhanced interface characteristics, which in turn may provide superior long-term stability of the resulting threshold voltage. For this purpose, a portion of the threshold adjusting semiconductor alloy may be modified, for instance, by oxidation, nitridation and the like, so that the modified portion may be removed on the basis of appropriate etch chemistries, such as wet chemical etch processes, thereby creating a surface of enhanced "smoothness" compared to the surface characteristics after the deposition of the threshold adjusting semiconductor alloy. Furthermore, during the subsequent process for forming the high-k dielectric material, the superior surface conditions may thus result in a smoother interface, which in turn may result in a reduced degree of formation of charge traps during the accumulated lifetime of the semiconductor device.

With reference to FIGS. 2a-2k, further illustrative embodiments will now be described in more detail, wherein reference may also be made to FIGS. 1a-1g, if appropriate.

Figure 2A:
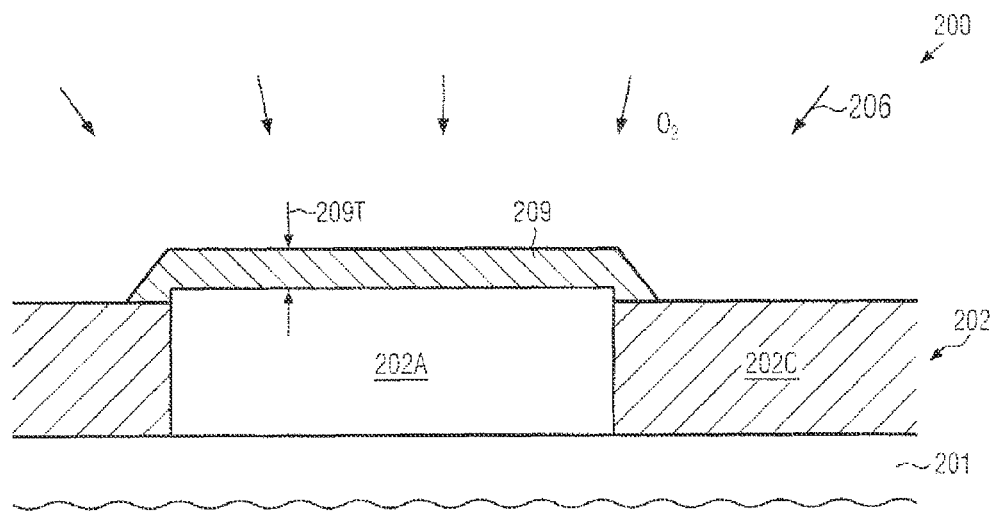
FIGS. 2a-2f schematically illustrate cross-sectional views of a semiconductor device during various manufacturing stages in forming a P-channel transistor on the basis of a threshold adjusting semiconductor alloy with superior interface characteristics, according to illustrative embodiments.

FIG. 2a schematically illustrates a cross-sectional view of a semiconductor device 200 comprising a substrate 201 and a semiconductor layer 202, which may, in combination, represent a bulk configuration or an SOI configuration, depending on the overall process and device requirements. In the manufacturing stage shown, the semiconductor layer 202 may comprise isolation structures 202C, for instance in the form of shallow trench isolations, thereby laterally delineating a plurality of semiconductor regions, such as a semiconductor region 202A, which may also be understood as an active region of a P-channel transistor to be formed in and above the active region 202A. The semiconductor region 202A may be substantially comprised of silicon, while, however, any other appropriate semiconductor materials may be used, if considered appropriate. It should further be appreciated that the substrate 201 and the semiconductor layer 202 may have similar characteristics, as is, for instance, previously explained with reference to the semiconductor device 100. Moreover, in the manufacturing stage shown, the semiconductor region 202A may have formed thereon a threshold adjusting semiconductor material 209, which is to be understood as a crystalline semiconductor material having different electronic characteristics compared to the material of the semiconductor region 202A. For instance, the material 209 may be provided in the form of a semiconductor mixture or alloy, such as a silicon/germanium alloy, when the semiconductor region 202A is substantially comprised of a crystalline silicon material. It should be appreciated that the semiconductor region 202A and the threshold adjusting semiconductor material 209 may represent the active region of the transistor still to be formed. As previously explained with reference to the semiconductor device 100, the threshold adjusting semiconductor material may have any appropriate material composition and thickness in order to obtain the desired threshold voltage in combination with a gate dielectric material and an electrode metal still to be formed above the semiconductor region 202A. For instance, for a silicon/germanium alloy, a germanium concentration of 20-30 atomic percent may be selected. Furthermore, a thickness 209T of the material 209 may be selected such that a desired target thickness is preserved after treating the material 209 and removing a treated portion thereof. For example, the thickness 209T may be selected such that a removal of approximately one nanometer or less during the subsequent processing of the material 209 may result in a desired target thickness of 8-50 Å, depending on the overall device requirements.

The semiconductor region 202A, the isolation structure 202C and the threshold adjusting semiconductor material 209 may be formed on the basis of any appropriate manufacturing technique, as is, for instance, previously explained with reference to the semiconductor device 100. After the deposition of the material 209, the device 200 may be subjected to a surface treatment 206 in order to modify a portion of the material 209, which may subsequently be removed in order to provide superior interface characteristics. In one illustrative embodiment, the treatment 206 may be performed as an oxidation process, for instance, based on elevated temperatures of 700-1100° C. in an oxidizing ambient, thereby providing a controllable oxidation rate of the material 209. Appropriate process parameters may be readily established on the basis of experiments or engineering experience, since the oxidation rate of a plurality of semiconductor materials may be well known. Consequently, a corresponding degree of material "consumption" of the material 209 during the treatment 206 may be adjusted in a highly controllable manner, thereby also enabling the selection of an appropriate initial thickness 209T in order to preserve a desired target thickness of the material 209 after the treatment 206. In other illustrative embodiments, the process 206 may be established on the basis of other oxidizing process atmospheres, as long as a uniform and controllable rate may be achieved. In other cases, the treatment 206 may be performed as a wet chemical etch process, in which the material 209 may be oxidized in a highly controllable manner. For example, a plurality of wet chemical agents are well established in semiconductor fabrication techniques, for instance in order to perform cleaning processes and the like, which may have an oxidizing behavior with respect to semiconductor materials, such as silicon, germanium and the like.

In other illustrative embodiments, the treatment 206 may represent a nitridation process in order to incorporate nitrogen species into the material 209, possibly in combination with oxygen, thereby also forming a corresponding surface layer, which may have a high etch selectivity with respect to a remaining portion of the material 209. For this purpose, a gas ambient, including nitrogen oxide and the like, ammonium and the like, may be applied on the basis of appropriate temperatures, wherein appropriate process parameters may also be readily established on the basis of experiments.

Figure 2B:
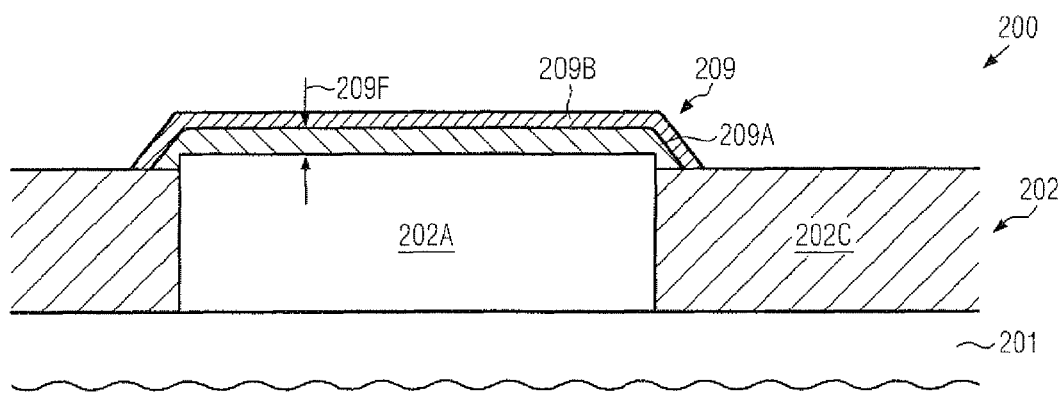

FIG. 2b schematically illustrates the semiconductor device 200 in a stage in which the "material" 209 may comprise a sub-layer 209B, for instance in the form of an oxide, a nitride, an oxynitride and the like, followed by a sub-layer 209A, which may represent a portion of the initially deposited material 209. It should be appreciated that the preserved material 209A may have a thickness 209F that may correspond to a target thickness as is required for adjusting an appropriate threshold voltage of a transistor still to be formed in and above the active region 202A. For example, approximately 10 Å or less of the initial material 209 (FIG. 2a) may be consumed during the process 206, wherein, however, it should be appreciated that a thickness of the sub-layer 209A may be significantly greater due to increase in volume of the material in the layer 209A compared to the initial material 209 of FIG. 2a.

Figure 2C:
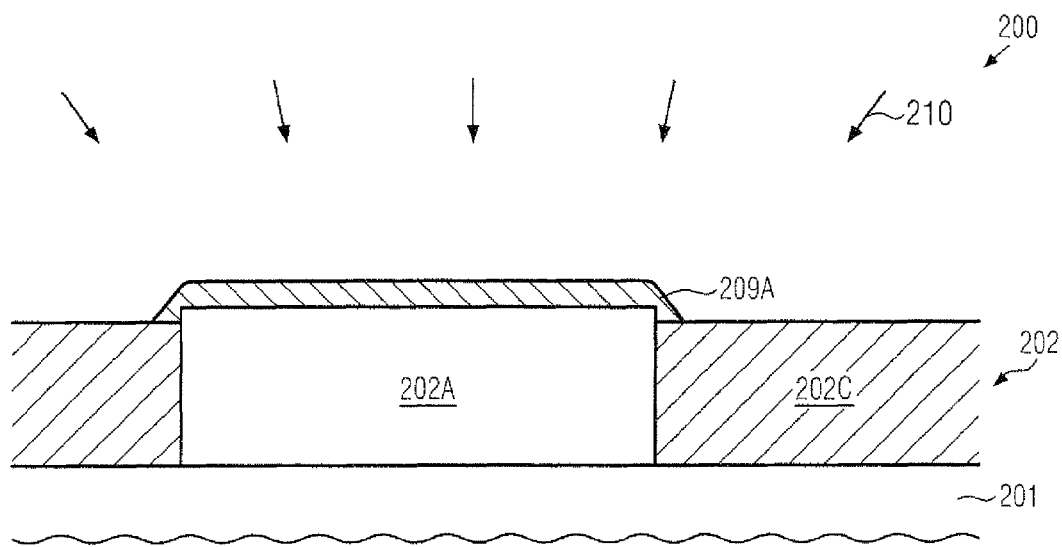

FIG. 2c schematically illustrates the semiconductor device 200 when exposed to an etch ambient 210, in which the modified portion 209B of FIG. 2b may be removed. For instance, the etch ambient 210 may be established on the basis of hydrofluoric acid (HF) if the material to be removed may be comprised of a semiconductor oxide material, wherein the preserved material 209A may act as an efficient etch stop material. In other cases, any other wet chemical etch recipes may be applied, for instance in the form of wet phosphoric acid, when the material to be removed may be substantially comprised of a nitride material and the like.

Figure 2D:
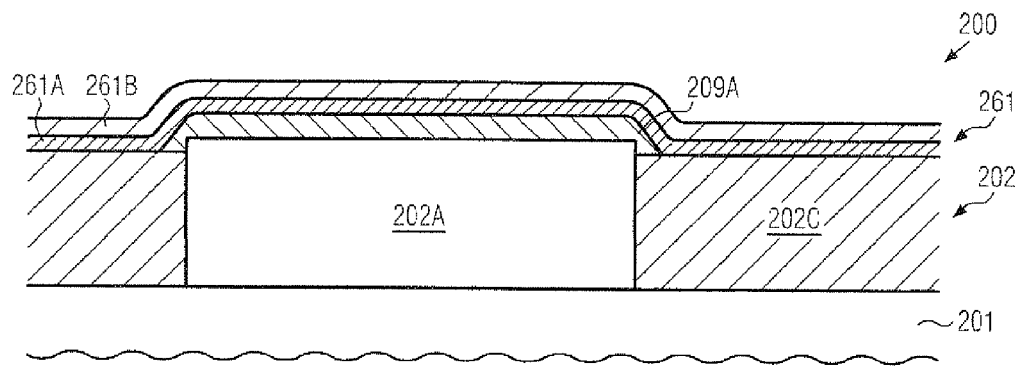

FIG. 2d schematically illustrates the semiconductor device 200 with a gate dielectric material 261 formed on the active region 202A including the preserved threshold adjusting material 209A. The dielectric material 261 may have a moderately high dielectric constant, i.e., a constant of approximately 10.0 or higher, which may be accomplished by incorporating an appropriate species into conventional dielectric materials, or by forming specifically designed dielectric materials. For example, the dielectric material 261 may comprise a first layer 261A, such as a silicon dioxide layer, a silicon oxynitride layer and the like, having a thickness of one nanometer and less, followed by a second layer 261B, which may have a significantly higher dielectric constant, for instance by incorporating hafnium, zirconium and the like. The dielectric material 261 may be formed on the basis of any appropriate process technique, as is, for instance, also described above with reference to the device 100, wherein, however, due to the preceding surface treatment and subsequent removal of the initially provided threshold adjusting semiconductor material, the material 209A, in combination with the dielectric material 261, may provide superior interface characteristics, for instance, a reduced degree of roughness may be achieved, thereby enhancing long-term stability with respect to thermal stress conditions in combination with the application of voltage pulses, as previously explained.

Figure 2E:
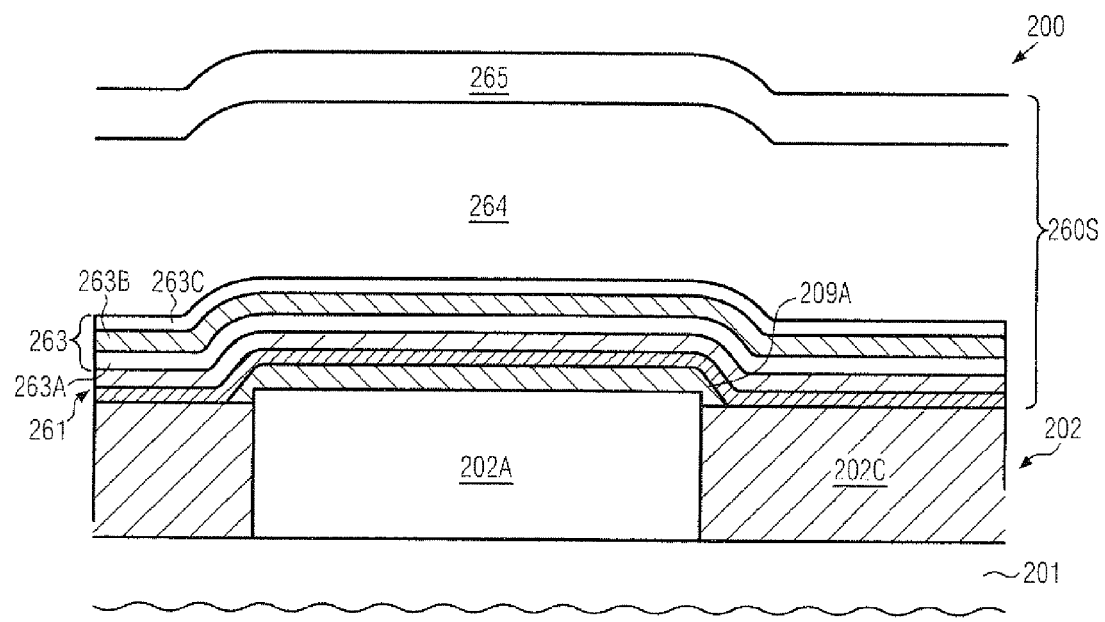

FIG. 2e schematically illustrates the semiconductor device 200 in a further advanced manufacturing stage in which a gate layer stack 260S, including the gate dielectric material 261, may be formed above the active region 202A, including the threshold adjusting semiconductor material 209A. The layer stack 260S may comprise a material system 263 acting as an electrode metal comprising an appropriate species for appropriately adjusting the work function, as is also previously explained. For instance, the material system 263 may comprise a titanium material layer 263A, followed by an aluminum layer 263B, which in turn may be confined by a further titanium nitride material 263C. It should be appreciated, however, that any other appropriate material systems may be provided in order to obtain the desired electronic characteristics of the gate layer stack 260S. Moreover, the layer stack 260S may comprise a further electrode material 264, such as amorphous silicon, polycrystalline silicon, a silicon/germanium material and the like. Additionally, a dielectric cap material 265 may be formed on the electrode material 264. The various material layers of the stack 260S may be formed on the basis of appropriate deposition techniques, as is, for instance, also described with reference to the device 100. It should be appreciated that any additional heat treatments and the like may be performed, possibly in the presence of appropriate species, such as nitrogen and the like, in order to initiate a diffusion of the work function adjusting species and stabilize the resulting configuration in order to obtain and preserve a desired state for adjusting a threshold voltage. Thereafter, the gate layer stack 260S may be patterned, for instance, by using hard masks and the like, in combination with sophisticated lithography and etch techniques.

Figure 2F:
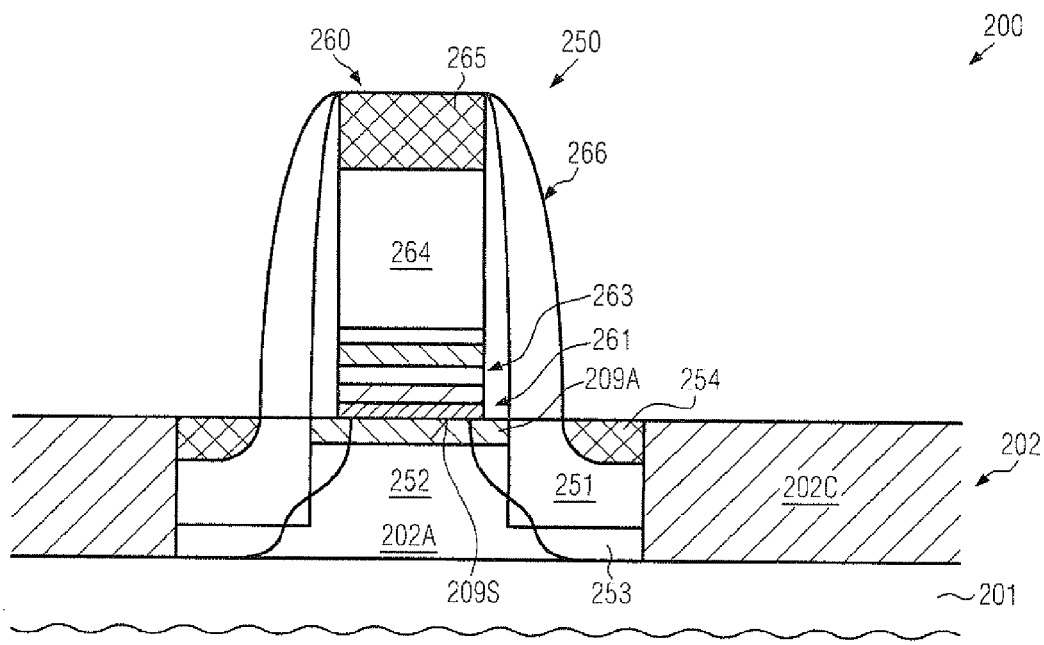

FIG. 2f schematically illustrates the semiconductor device 200 in a further advanced manufacturing stage. As illustrated, a transistor 250 may be formed in and above the active region 202A and may comprise a gate electrode structure 260 formed from the gate layer stack 260S of FIG. 2e. Consequently, the gate electrode structure 260 may comprise a gate dielectric material 261 having the superior interface characteristics in combination with the threshold adjusting semiconductor alloy 209A, as previously discussed. Furthermore, the material system 263 may be provided, followed by the electrode material 264 and a metal silicide region 265. Moreover, a sidewall spacer structure 266 may be provided so as to laterally confine the materials 261, 263, 264 and 265. The transistor 250 may further comprise drain and source regions 253 in combination with metal silicide regions 254. Furthermore, in the embodiment shown, a strain-inducing semiconductor material 251 may be formed in a portion of the active region 202A in order to induce a desired type of strain in a channel region 252. It is well known that strain in a semiconductor material may significantly affect the charge carrier mobility, which in turn may modify the conductivity of a transistor channel region, such as the region 252. For P-channel transistors, such as the transistor 250, a compressive strain component may be advantageous for many crystallographic configurations of the channel region 252, which may be accomplished by providing a compressive strain-inducing semiconductor material, for instance in the form of silicon/germanium and the like.

The semiconductor device 200 as illustrated in FIG. 2f may be formed on the basis of any appropriate process techniques. That is, after patterning the gate electrode structure 260, the strain-inducing material 251 may be provided, if required, which may be accomplished by forming recesses in the active region 202A and filling the same with the strain-inducing semiconductor material on the basis of selective epitaxial growth techniques. For this purpose, a portion of the spacer structure 266 may confine sensitive materials of the gate electrode structures 260. Thereafter, the drain and source regions 253 may be formed in accordance with well-established implantation techniques in combination with anneal techniques. Thereafter, the metal silicide regions 254 and 265 may be formed by using any appropriate process strategy.

Consequently, the transistor 250 may have an appropriate threshold voltage, which may be determined by the material 209A, the dielectric material 261, in combination with the material system 263 and also in combination with the lateral and vertical dopant profile in the active region 202A, wherein the superior characteristics of an interface 209S may provide a reduced threshold voltage shift over the accumulated operating time of the device 200, thereby increasing the usable lifetime of this device.

Figure 2G:
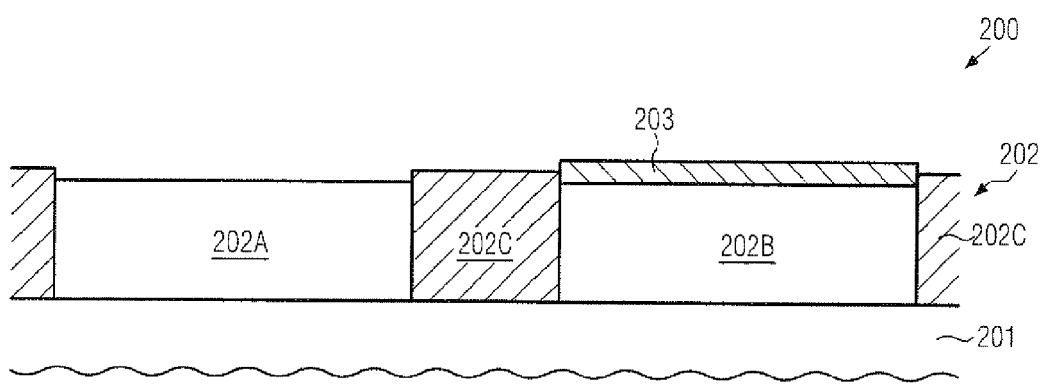
FIGS. 2g-2k schematically illustrate cross-sectional views of the semiconductor device during various manufacturing stages in forming a P-channel transistor and an N-channel transistor, according to further illustrative embodiments.

FIG. 2g schematically illustrates the semiconductor device 200 according to further illustrative embodiments. As illustrated, a second active region 202B may be provided in the semiconductor layer 202 and may have formed thereon a mask 203, such as an oxide material and the like. Moreover, in the embodiment shown, the active region 202A may be recessed with respect to the isolation structure 202C, if considered appropriate.

The device 200 as illustrated in FIG. 2g may be formed on the basis of similar process techniques as previously described with reference to the device 100. Furthermore, if a certain degree of recessing of the active region 202A may be considered advantageous, the device 200 may be exposed to a wet chemical etch ambient in order to remove a portion of the active region 202A with respect to the isolation structure 202C and the mask 203. For this purpose, highly selective etch chemicals are available, for instance in the form of tetra methyl ammonium hydroxide (TMAH), which may efficiently remove silicon material selectively to silicon dioxide, silicon nitride and the like. Thus, in a first process phase, any mask material may be removed from the active region 202A, for instance, based on process techniques as previously described with reference to the device 100, thereby obtaining a desired smooth surface of the active region 202A. Thereafter, the recessing may be accomplished on the basis of a wet chemical etch process, thereby reducing any irregularities during the subsequent selective epitaxial growth process, since a uniform growth behavior may also be obtained at the isolation structures 202C due to avoiding a lateral growth of the semiconductor material. In this case, the overall uniformity of the resulting threshold adjusting semiconductor material may further be enhanced. In other cases, if a corresponding recessing may not be required, the further processing may be continued without performing an additional etch process.

Figure 2H:
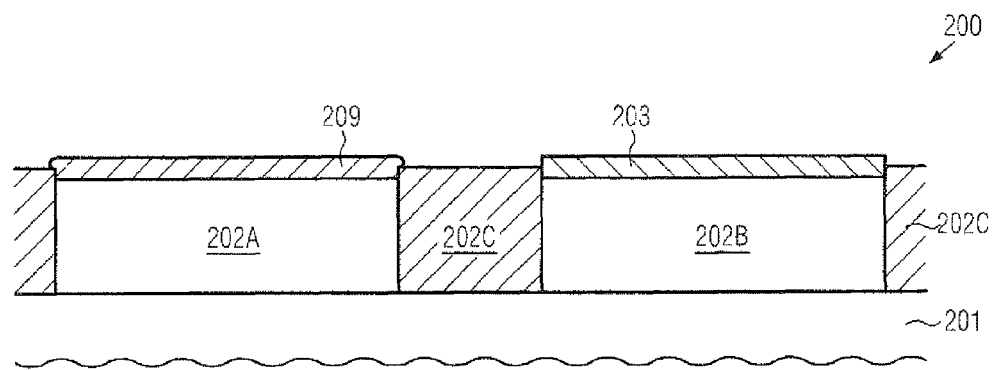

FIG. 2h schematically illustrates the device 200 in a further advanced manufacturing stage. As illustrated, the material 209 may be formed on the semiconductor region 202A. For this purpose, a selective epitaxial growth process may be applied, as is also previously explained. It should be appreciated that, in some illustrative embodiments, the recessing of the semiconductor region 202A, if required, and the growth of the material 209 may be performed as an in situ process, i.e., the etch process and the growth process may be performed in the same process chamber as subsequent processes without any intermediate transport activities. To this end, a reactive etch ambient may be established in the deposition chamber in order to remove silicon material, thereby also preparing the resulting surface of the active region 202A for the subsequent process phase for depositing the material 209.

Figure 2I:
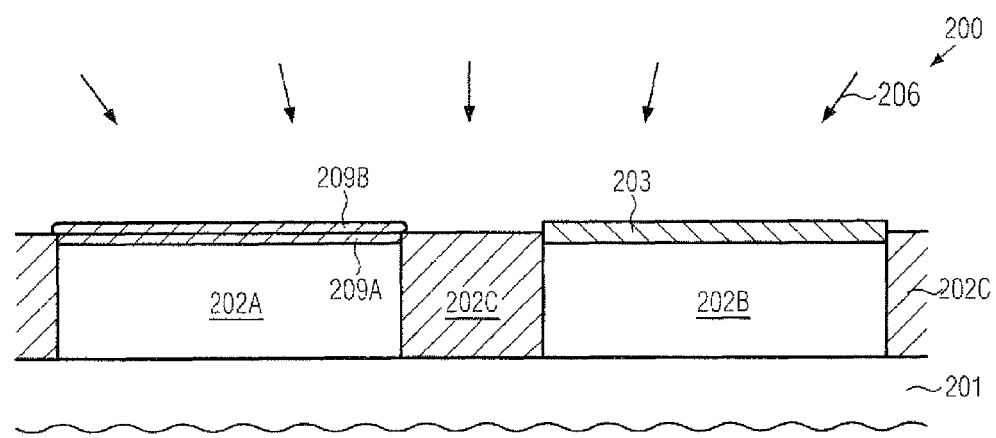

FIG. 2i schematically illustrates the device 200 when performing the surface treatment 206 in order to form the modified portion 209B, for instance in the form of an oxide material, while preserving the material 209A.

Figure 2J:
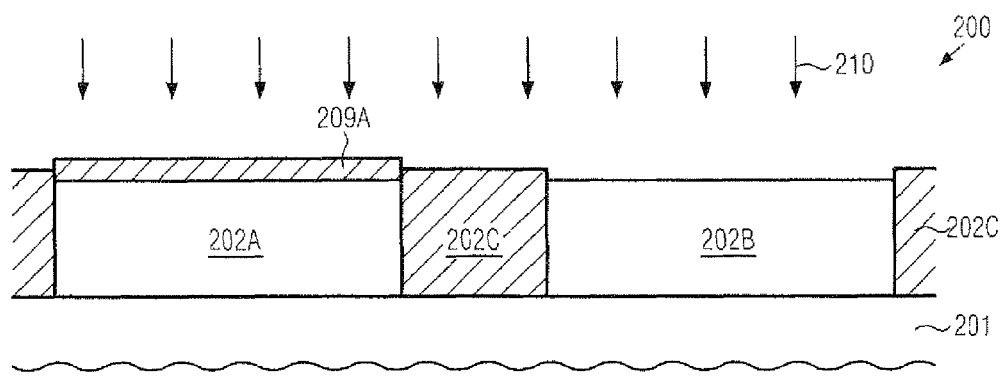

FIG. 2j schematically illustrates the semiconductor device 200 during the etch process 210 in order to remove the modified portion 209B (FIG. 2i), thereby exposing the threshold adjusting semiconductor material 209A. At the same time, the mask 203 (FIG. 2i) may also be removed from the semiconductor region 202B, which may be accomplished on the basis of hydrofluoric acid and the like. In some illustrative embodiments, the process 210 may also be used for preparing the device 200 for the formation of a gate dielectric material by removing any contaminants, metal residues and the like. Thus, the material 209A may have a superior surface and uniformity, which may further be enhanced by recessing the semiconductor region 202A, as is described with reference to FIG. 2g.

Figure 2K:
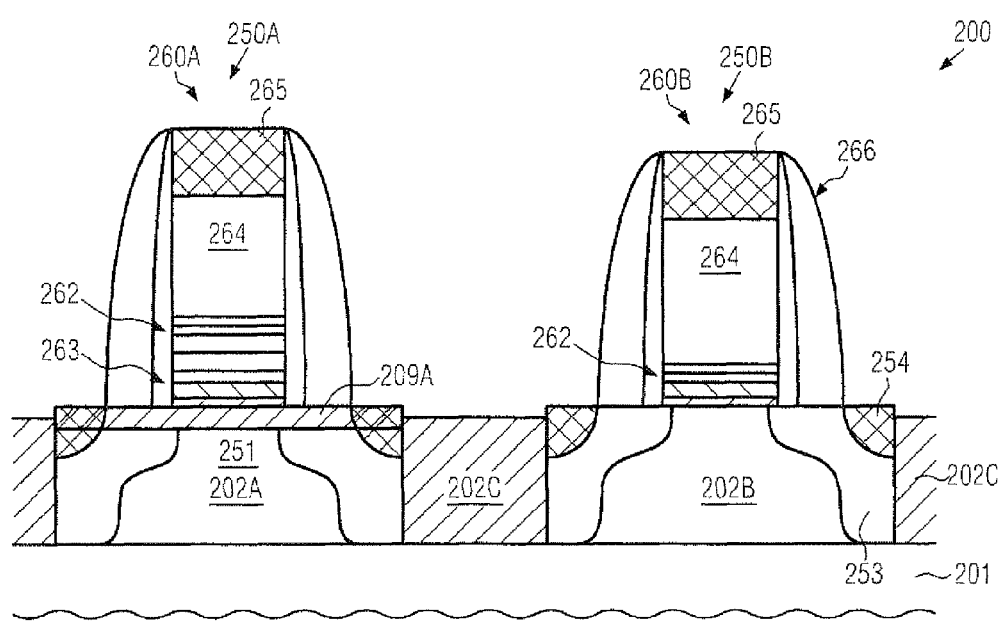

FIG. 2k schematically illustrates the semiconductor device 200 in a further advanced manufacturing stage. As illustrated, a transistor 250A may be formed in and above the active region 202A and may comprise a gate electrode structure 260A. Similarly, a transistor 250B may be formed in and above the semiconductor region 202B and may comprise a gate electrode structure 260B. The gate electrode structure 260A may comprise a material system 263 that is appropriately designed in order to obtain the desired work function, which may result in a desired threshold voltage in combination with the material 209A and in combination with appropriately designed drain and source regions 253 and a channel region 251. Moreover, a further material system 262 may be provided in the gate electrode structure 260A, depending on the process requirements, in combination with an electrode material 264 and a metal silicide region 265. On the other hand, the gate electrode structure 260B may comprise the material system 262 for adjusting the threshold voltage, followed by the materials 264 and 265.

The transistors 250A, 250B may be formed starting from the manufacturing stage as shown in FIG. 2j on the basis of similar process techniques as are previously described, for instance, with reference to the transistor 250 (FIG. 2f).

As a result, manufacturing techniques are disclosed herein in which long-term stability of threshold voltages of sophisticated transistors comprising a threshold adjusting semiconductor material may be improved by enhancing the characteristics of an interface formed between the threshold adjusting semiconductor material and the gate dielectric material. To this end, a portion of the threshold adjusting semiconductor material may be removed by using a surface treatment, such as oxidation, in combination with wet chemical etch techniques, prior to forming the gate dielectric material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a gate electrode structure, the method comprising:
   forming a semiconductor device having a substrate and a semiconductor region formed on said substrate, wherein the semiconductor region includes a semiconductor layer having at least one isolation structure;
   removing material of said semiconductor region of said semiconductor device so as to form a recess in said semiconductor region;
   forming a layer of a semiconductor alloy on said semiconductor region and in said recess;
   oxidizing said layer of said semiconductor alloy so as to form a first sub-layer comprised of said semiconductor alloy and a second sub-layer comprised of an oxide of said semiconductor alloy, wherein forming said layer of a semiconductor alloy and oxidizing said layer comprises performing an in situ process;
   removing said second sub-layer;
   forming a gate layer stack on said first sub-layer, said gate layer stack comprising a gate dielectric material, a work function adjusting species and an electrode material; and
   forming said gate electrode structure of a transistor from said gate layer stack.

2. The method of claim 1, wherein oxidizing said layer of a semiconductor alloy comprises annealing said layer of a semiconductor alloy in an oxidizing ambient.

3. The method of claim 1, wherein removing said second sub-layer comprises performing a wet chemical etch process.

4. The method of claim 3, wherein said wet chemical etch process comprises etching using phosphoric acid.

5. The method of claim 1, wherein removing said material of said semiconductor region and forming said layer of a semiconductor alloy are performed as an in situ process.

6. The method of claim 1, wherein said semiconductor alloy is a silicon/germanium alloy.

7. The method of claim 6, wherein a germanium fraction is 30 atomic percent or less.

8. The method of claim 1, wherein said second sub-layer is formed so as to have a thickness of 10 Å or less.

9. The method of claim 1, further comprising forming drain and source regions of a P-channel transistor in said semiconductor region.

10. The method of claim 9, wherein said P-channel transistor comprises an active region having a strain-inducing portion.

11. The method of claim 10, wherein said strain-inducing portion comprises a compressive strain.

12. The method of claim 9, further comprising forming at least one metal silicide region in said semiconductor region.

13. The method of claim 1, wherein said gate dielectric material has a dielectric constant of at least approximately 10.0.

14. The method of claim 13, wherein said gate dielectric material comprises at least one of hafnium or zirconium.

15. The method of claim 1, wherein said work function adjusting species comprises at least one of lanthanum or aluminum.

16. The method of claim 15, wherein said gate layer stack comprises at least one of titanium or titanium nitride.

17. The method of claim 1, wherein said first sub-layer and said gate dielectric material form an interface that is resistant to threshold voltage shift.

* * * * *